United States Patent
Boshra

(10) Patent No.: US 9,224,590 B2
(45) Date of Patent: Dec. 29, 2015

(54) FINGER BIOMETRIC SENSOR INCLUDING SLIDING MOTION AND STATIC POSITIONING BASED BIOMETRIC DATA GENERATION AND RELATED METHODS

(71) Applicant: APPLE INC., Cupertino, CA (US)

(72) Inventor: Michael Boshra, Melbourne, FL (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/014,761

(22) Filed: Aug. 30, 2013

(65) Prior Publication Data

US 2015/0063660 A1 Mar. 5, 2015

(51) Int. Cl.
- G06K 9/00 (2006.01)
- G06K 9/74 (2006.01)
- H01L 21/02 (2006.01)

(52) U.S. Cl.
CPC ...... *H01L 21/02013* (2013.01); *G06K 9/00033* (2013.01); *H01L 21/02019* (2013.01)

(58) Field of Classification Search
None
See application file for complete search history.

(56) References Cited

U.S. PATENT DOCUMENTS

| | | |
|---|---|---|
| 5,940,526 A | 8/1999 | Setlak et al. |
| 6,289,114 B1 * | 9/2001 | Mainguet ............ 382/124 |
| 7,616,787 B2 | 11/2009 | Boshra |
| 2005/0036665 A1 * | 2/2005 | Higuchi ............ 382/124 |
| 2007/0019844 A1 * | 1/2007 | Yumoto et al. ............ 382/124 |
| 2008/0115981 A1 * | 5/2008 | Bechtel ............ 178/19.01 |
| 2013/0076485 A1 * | 3/2013 | Mullins ............ 340/5.83 |
| 2014/0003678 A1 * | 1/2014 | Vieta et al. ............ 382/124 |
| 2014/0270414 A1 * | 9/2014 | Slaby et al. ............ 382/124 |

* cited by examiner

*Primary Examiner* — Randolph I Chu
(74) *Attorney, Agent, or Firm* — Allen, Dyer, Doppelt, Milbrath & Gilchrist, P.A.

(57) ABSTRACT

A finger biometric sensor may include an array of finger biometric sensing pixels, and processing circuitry. The processing circuitry may be capable of acquiring finger biometric data from the array of finger biometric sensing pixels and generating image data from the finger biometric data. The image data may be generated based upon at least a finger sliding motion when a finger is slid adjacent the array of finger biometric sensing pixels, and a finger static positioning when the finger is statically positioned adjacent the array of finger biometric sensing pixels. The processing circuitry may also be capable of determining a match between the image data and enrolled image data.

13 Claims, 8 Drawing Sheets

_US 9,224,590 B2_

FINGER BIOMETRIC SENSOR INCLUDING SLIDING MOTION AND STATIC POSITIONING BASED BIOMETRIC DATA GENERATION AND RELATED METHODS

FIELD OF THE INVENTION

The present invention relates to the field of electronics, and, more particularly, to electronic devices including finger biometric sensors and related methods.

BACKGROUND

A finger biometric sensor may be classified into two types: a touch-based or static positioning finger biometric sensor and a slide-based finger biometric sensor. A touch-based finger biometric sensor requires the finger to stay stationary during finger biometric data acquisition. On the other hand, a slide-based finger biometric sensor requires the finger to move relative to the finger biometric sensor for the acquisition of finger biometric data.

A touch-based finger biometric sensor may be characterized by a relatively large sensing area, which may increase production cost. Thus, the use of a touch-based finger biometric sensor may be limited, for example, to government and access-control applications. On the other hand, a slide-based finger biometric sensor may have a relatively small sensing area, which may significantly reduce production costs. Accordingly, slide-based finger biometric sensors have become increasingly popular, with increased deployment in consumer-electronic devices, such as, for example, mobile wireless communications devices.

SUMMARY

A finger biometric sensor may include an array of finger biometric sensing pixels, and processing circuitry. The processing circuitry may be capable of acquiring finger biometric data from the array of finger biometric sensing pixels and generating image data from the finger biometric data. The image data may be generated based upon at least a finger sliding motion when a finger is slid adjacent the array of finger biometric sensing pixels, and a finger static positioning when the finger is statically positioned adjacent the array of finger biometric sensing pixels. The processing circuitry may also be capable of determining a match between the image data and enrolled image data. Accordingly, the finger biometric sensor may address a dual-use mode by acquiring finger biometric data when a finger is slid across the sensor and/or positioned statically adjacent the sensor.

The processing circuitry may be capable of generating the image data to be of a sufficient amount to permit determining the match between the image data and the enrolled image data. The processing circuitry may be capable of acquiring the finger biometric data by at least acquiring a sequence of finger biometric data sets from respective overlapping pixel sets of the array of finger biometric sensing pixels, for example.

The processing circuitry may be capable of generating image data by at least comparing the sequence of finger biometric data sets. The processing circuitry may be capable of comparing the sequence of finger biometric data sets by at least comparing finger biometric data from each pixel set to finger biometric data from a next pixel set of the overlapping pixel sets, for example.

The processing circuitry may be capable of comparing finger biometric data from neighboring pixels along a border between overlapping pixel sets. The processing circuitry may be capable of comparing the sequence of finger biometric data sets by at least determining respective relative alignments of the overlapping pixel sets, for example.

The array of finger biometric finger sensing pixels may include an array of electric field finger biometric sensing pixels. The finger biometric sensor may further include drive circuitry coupled to the array of finger biometric sensing pixels, for example.

An electronic device aspect is directed to an electronic device that includes a portable housing, a wireless transceiver carried by the portable housing, and the finger biometric sensor carried by the portable housing.

A method aspect is directed to a method of sensing a finger biometric that includes acquiring finger biometric data from an array of finger biometric sensing pixels and generating image data from the finger biometric data. The image data may be generated based upon at least a finger sliding motion when a finger is slid adjacent the array of finger biometric sensing pixels, and a finger static positioning when the finger is statically positioned adjacent the array of finger biometric sensing pixels. The method may also include determining a match between the image data and enrolled image data.

DETAILED DESCRIPTION

Figure 1:
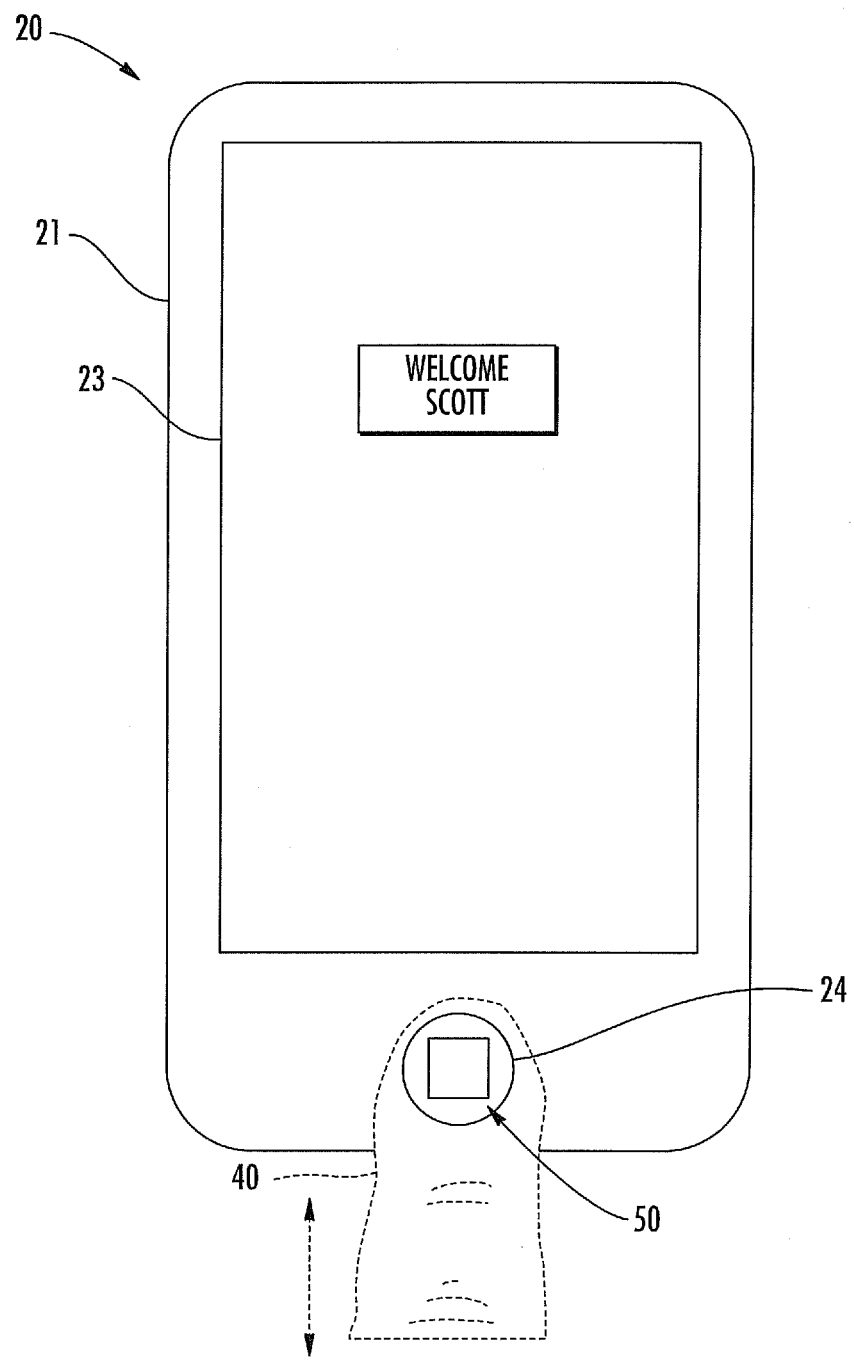
FIG. 1 is a plan view of an electronic device according to an embodiment.
Figure 2:
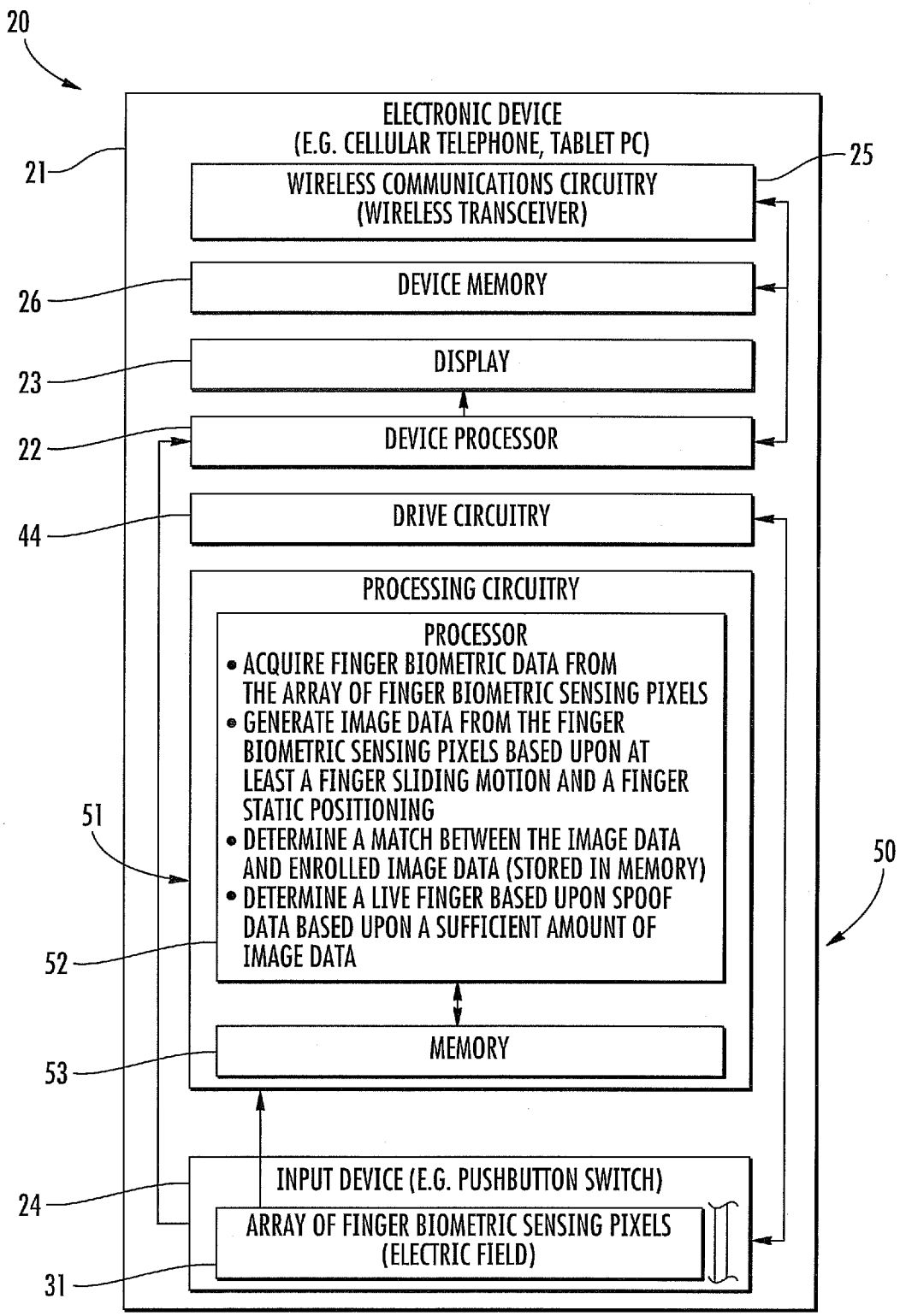
FIG. 2 is a schematic block diagram of the electronic device of FIG. 1.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout and prime and multiple prime notation is used to describe similar elements in different embodiments.

Referring initially to FIGS. 1-4, an electronic device 20 is now described. The electronic device 20 illustratively includes a portable housing 21 and a device processor 22 carried by the portable housing. The electronic device 20 is illustratively a mobile wireless communications device, for example, a cellular telephone. The electronic device 20 may be another type of electronic device, for example, a tablet computer, laptop computer, etc. In some embodiments, the electronic device 20 may be an integrated circuit for use with another or host electronic device.

Wireless communications circuitry 25 (e.g. a wireless transceiver, cellular, WLAN Bluetooth, etc.) is also carried within the housing 21 and coupled to the device processor 22. The wireless transceiver 25 cooperates with the device processor 22 to perform at least one wireless communications function, for example, for voice and/or data. In some embodiments, the electronic device 20 may not include a wireless transceiver 25.

A display 23 is also carried by the portable housing 21 and is coupled to the device processor 22. The display 23 may be a liquid crystal display (LCD), for example, or may be another type of display, as will be appreciated by those skilled in the art. A device memory 26 is also coupled to the processor 22.

A finger-operated user input device, illustratively in the form of a pushbutton switch 24, is also carried by the portable housing 21 and is coupled to the device processor 22. The pushbutton switch 24 cooperates with the device processor 22 to perform a device function in response to the pushbutton switch. For example, a device function may include a powering on or off of the electronic device 20, initiating communication via the wireless communications circuitry 25, and/or performing a menu function.

More particularly, with respect to a menu function, the device processor 22 may change the display 23 to show a menu of available applications based upon pressing of the pushbutton switch 24. In other words, the pushbutton switch 24 may be a home switch or button, or key. Of course, other device functions may be performed based upon the pushbutton switch 24. In some embodiments, the finger-operated user input device 24 may be a different type of finger-operated user input device, for example, forming part of a touch screen display. Other or additional finger-operated user input devices may be carried by the portable housing 21.

The electronic device 20 includes a finger biometric sensor 50, which may be in the form of one or more integrated circuits (ICs). The finger biometric sensor 50 includes an array of finger biometric sensing pixels 31 that may be part of an IC carried by the pushbutton switch 24 to sense a user's finger 40 or an object placed adjacent the array of electric field sensing pixels. Each pixel of the array of finger biometric sensing pixels 31 may be an electric field sensing pixel as disclosed in U.S. Pat. No. 5,940,526 to Setlak et al., for example, assigned to the present assignee, and the entire contents of which are herein incorporated by reference.

A cross-use mode can be defined as placing a stationary finger on a slide-based finger biometric sensor, or moving a finger on a touch-based finger biometric sensor. A cross-use mode typically results in the failure of finger biometric data acquisition or, as a result, finger image acquisition. This is generally not an issue in a supervised application since the user is given proper instructions on how to use the touch-based finger biometric sensor. It is also typically not an issue in applications involving a fairly small population (e.g., employees of a given company) as a result of training. The cross-use mode, however, may be a relatively large issue in deployments involving large masses of untrained users, such as, for example, use in mobile wireless communications devices. Currently, however, these deployments overwhelmingly use slide-based finger biometric sensors.

It may be common for a casual user to place his/her finger on a slide-based finger biometric sensor without motion and expect it to work. While an error message may help mitigate this problem, a user may not always read any error messages. Addressing the cross-use problem for a slide-based finger biometric sensor may be increasingly difficult since a slide-based finger biometric sensor can only capture a very small section of the finger at any given time.

Accordingly, a touch-based finger biometric sensor is typically regarded as being more intuitive to the casual user than a slide-based finger biometric sensor. Thus, it may be desirable to develop a relatively small touch-based finger biometric sensor at a relatively low cost. For example, one touch-based finger biometric sensor has a sensing area with dimensions of 6.5 mm×6.5 mm (128×128 pixel array @ 500 dpi). However, with potential wide deployment of relatively small touch-based finger biometric sensors, cross-use mode increasingly becomes an issue.

To address the cross-use mode, the finger biometric sensor 50 also includes processing circuitry 51 coupled to the array of electric field sensing pixels 31. The array of electric field sensing pixels 31 is carried by the pushbutton switch 24 so that when a user or object contacts, presses downward on the pushbutton switch, and/or slides adjacent the array of finger biometric sensing pixels 31, the processing circuitry 51 cooperates with the array so that finger biometric data from the user's finger 40 is acquired, for example, finger biometric data for finger matching and/or spoof detection, as will be appreciated by those skilled in the art. In other words, the array of electric field sensing pixels 31 may cooperate with the processing circuitry 51 to be responsive to both static contact and placement of the user's finger 40 or object and sliding motion or contact.

The finger biometric sensor 50 also includes drive circuitry 44 capable of generating a drive signal coupled to the array of finger sensing pixels 31. The array of finger sensing pixels 31 cooperates with the drive circuitry 44 to generate a detected signal based upon placement of the finger 40 adjacent the array of finger sensing pixels, as will be appreciated by those skilled in the art.

The processing circuitry 51, which may include a processor 52 and memory 53 coupled thereto, also generates image data from the finger biometric data. The processing circuitry 51 generates the image data from the finger biometric data based upon a finger sliding motion when the finger 40 is slid adjacent the array of finger biometric sensing pixels 31. The processing circuitry 51 also generates the image data based upon a finger static positioning when the finger 40 is positioned adjacent the array of finger biometric sensing pixels 31. The processing circuitry 51 generates the image data to be of a sufficient amount to permit a finger match operation to be performed, as will be described in further detail below.

Figure 3:
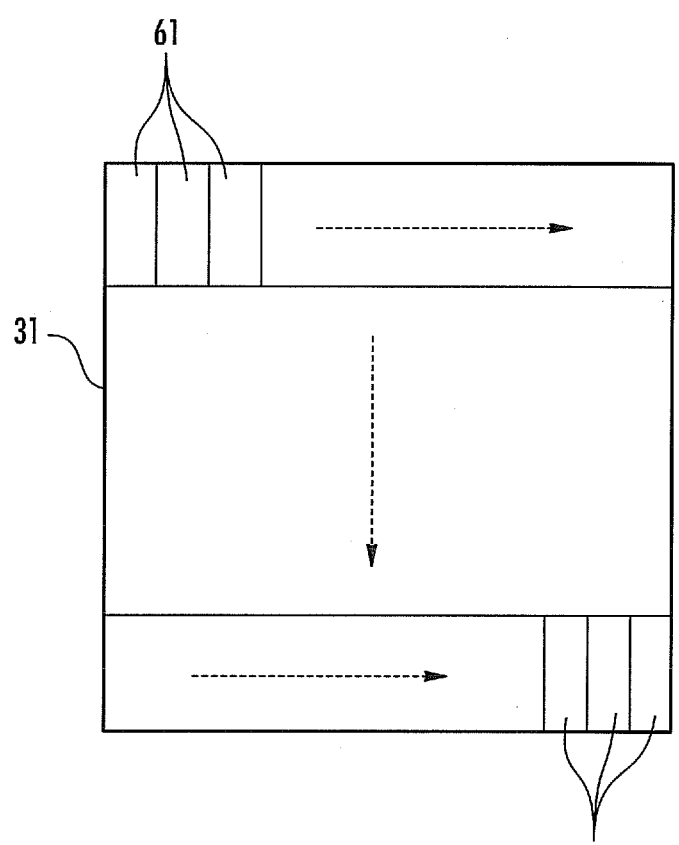
FIG. 3 is a diagram illustrating acquisition of finger biometric data from basic regions of an array of finger biometric sensing pixels in accordance with an embodiment.

As will be appreciated by those skilled in the art, many touch or static positioning finger biometric sensors do not acquire finger biometric data or generate image data instantaneously. Rather, the image data is generated by the processing circuitry 51 based upon acquisition of finger biometric data from a set of small regions or subsets of the array of finger biometric sensing pixels 31. Each of these regions, which may be referred to as a basic region 61, is sensed rather quickly relatively to an allowable slide speed, and thus sensing can be assumed to be instantaneous. Basic regions 61 are sequentially sensed in a raster fashion until a whole image, corresponding to the user's finger 40, for example, is formed (FIG. 3). For example, for a 128×128 array of finger biometric sensing pixels with a basic region of size 8×2, a full image may be obtained through sensing operations of a 16×64 basic region array.

Figure 4:
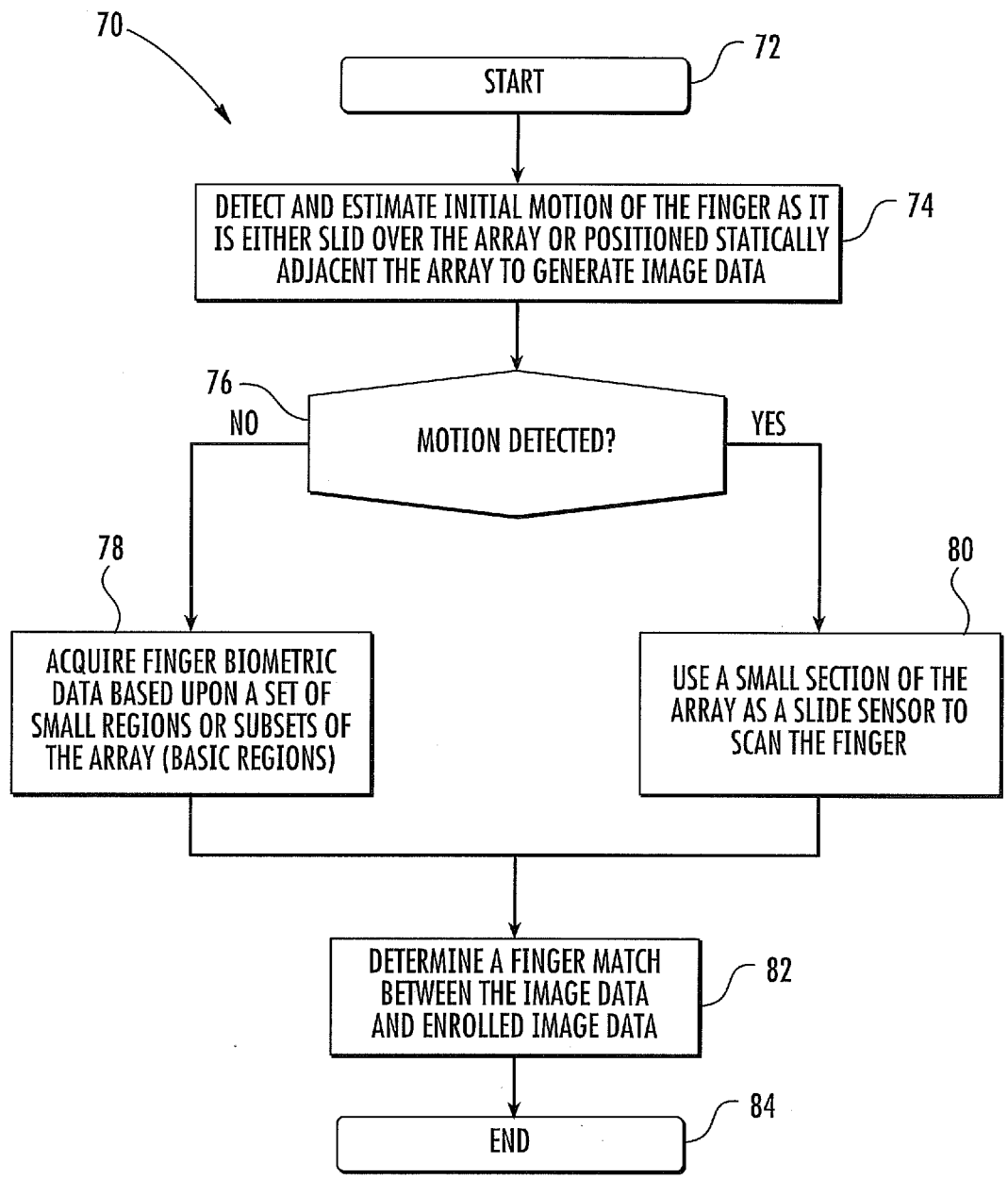
FIG. 4 is a flowchart of a method of sensing a finger biometric according to an embodiment.

Referring now to additionally to the flowchart 70 in FIG. 4, beginning at Block 72, in one embodiment, the processing circuitry 51 generates the image data based upon a finger sliding motion when a finger is slid adjacent the array 31, and a finger static positioning when the finger is statically positioned adjacent the array (i.e., supporting both touch and slide modes). To do this, the processing circuitry 51 detects and estimates initial motion of the finger (Block 74). The processing circuitry 51 may perform these detecting and estimating operations by generating image data based upon finger biometric data acquired from two snapshots of a small central fingerprint region and comparing, or more particularly, correlating the image data for two snapshots. Of course, any number of snapshots may be correlated. This operation may be similar to operations performed in fingerprint-based navigation, as will be appreciated by those skilled in the art.

If no motion is detected (Block 76), then the processing circuitry 51 acquires the finger biometric data and generates the image data as described above (Block 78). In contrast, if motion is detected (Block 76), a small section of the array of finger biometric pixels is used as a slide sensor to scan the finger 40 (Block 80). However, this approach may have a sensitivity to error in estimating initial motion as it may not address the case when the finger 40 changes between a static positioning and a finger sliding motion, and vice versa, during acquisition of the finger biometric data. (e.g., the finger starts stationary then moves, or starts moving then stops). Moreover, if the finger 40 is determined to be moving, then most of the array of finger biometric sensing pixels 31 would not be used.

The processing circuitry 51, for example, may also cooperate with the array of finger biometric sensing pixels 31 to determine a finger match based upon the image data (Block 82). More particularly, the processor 52 may determine a finger match based upon enrollment image data stored in the device memory 53 and the sufficient amount of generated image data. Enrollment data may typically be collected over a series of regions of a finger that are then assembled or composited into a larger region. The match or generated image data may be smaller, but still having a number of matching features to provide a desired rate of matching.

In some embodiments, the processor 52 may also determine a live finger based upon spoof data. More particularly, the processor 52 may determine a live finger based upon a complex impedance and/or bulk impedance measurement. The method ends at Block 84.

In some embodiments, the processor 52 may cooperate with the array finger biometric sensing pixels 31 to perform a navigation function, for example. Of course the processor 52 may cooperate with the array finger biometric sensing pixels 31 and/or other circuitry to perform other or additional functions, as will be appreciated by those skilled in the art.

It should be understood that in some embodiments, the processing circuitry 51 may be part of or included in the device processor 22. In other words, the functionality described herein with respect to the processing circuitry 51 may be performed by the device processor 22, another processor, or shared between or among processors.

Figure 5:
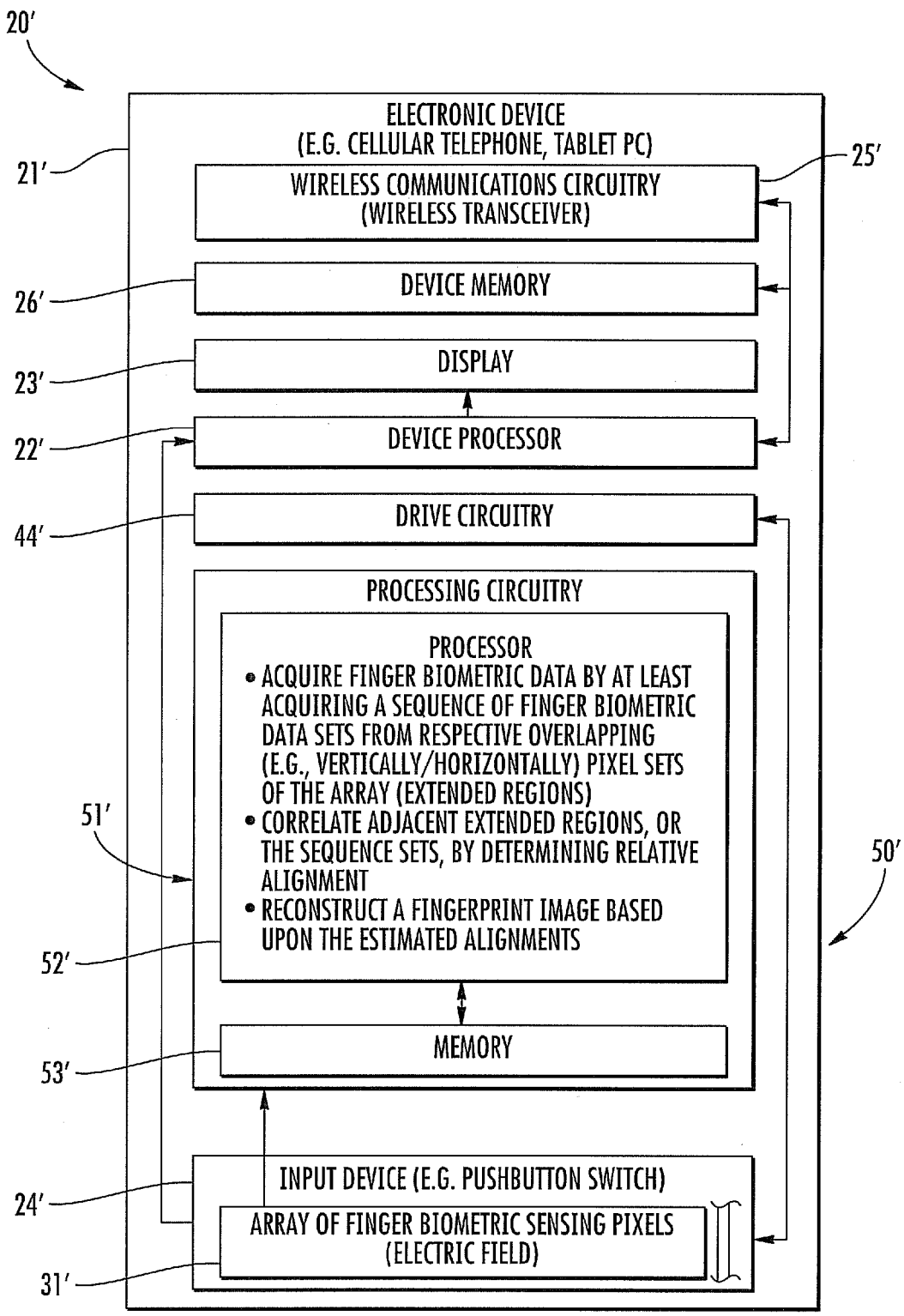
FIG. 5 is a schematic block diagram of an electronic device including a finger biometric sensor in accordance with another embodiment.
Figure 6:
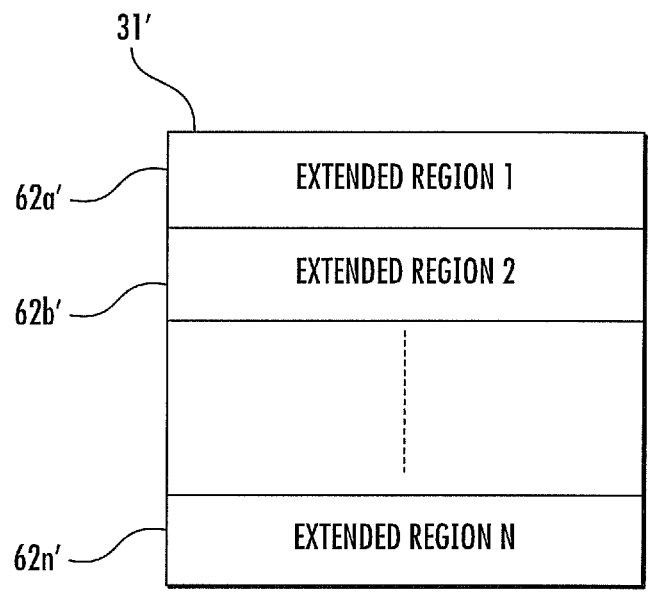
FIG. 6 is a diagram illustrating neighboring extended regions of an array of finger biometric sensing pixels in accordance with the embodiment of FIG. 5.
Figure 7:
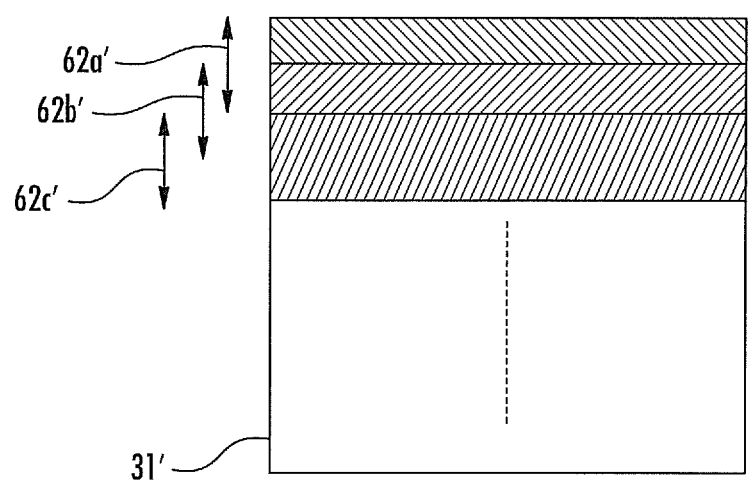
FIG. 7 is a diagram illustrating overlapping extended regions of an array of finger biometric sensing pixels in accordance with the embodiment of FIG. 5.

Referring now to FIGS. 5-7, in another embodiment, to address the increased sensitivity to error, for example, the processing circuitry 51' acquires the finger biometric data by at least acquiring a sequence of finger biometric data sets from respective overlapping pixel sets of the array of finger biometric sensing pixels 31'. The overlapping pixel sets may be vertically overlapping and/or horizontally overlapping. More particularly, the above-described basic regions are grouped into a set of extended regions 62a'-62n'. An extended region 62a'-62c' is selected such that finger motion during acquisition is considered to be small. Based upon this selection, basic regions within an extended region are scanned contiguously. For example, extended regions may be obtained by grouping basic regions of a same row, as illustrated in FIG. 6. This grouping corresponds to a horizontal basic-region scanning (i.e., top-down or bottom-up). It should be noted that in some embodiments, the extended regions may not be the union of the basic regions, unless, for example, the basic regions are 1×1.

To facilitate seamless touch-slide support, the neighboring extended regions 62a'-62c' may be chosen to overlap, for example, have some overlap, with each other. An example is illustrated in FIG. 7 where the arrows indicate overlap.

The processing circuitry 51' sequentially acquires extended regions in a sequence that is independent of whether the finger is stationary or moving. The processing circuitry 51' correlates adjacent extended regions, or the sequence of finger biometric data sets, by determining relative alignment (due to the extended-region overlap, consecutive regions overlap in the absence of finger motion). The processing circuitry 51' may use the image data to reconstruct a fingerprint image based upon the estimated alignments. The reconstruction algorithm may be the same for both touch (finger static positioning) and slide (finger sliding motion) modes. The reconstruction algorithm, any correlation algorithm, or other algorithm may be stored in the memory 53' of the processing circuitry 51'.

It should be noted that redundancy in the extended regions does not necessarily translate to an increase in acquisition time. For example, in some finger biometric sensors, a pixel value may be obtained by taking a number of samples (e.g., 16) and then averaging the samples. It may be possible to cut the sampling rate in half (e.g., 8×), and then take the average of the corresponding pixels during the image reconstruction process. This generally has the same effect as the original averaging at the finger biometric sensor level (e.g., 16×). Additionally, while both slide directions are supported, a maximum threshold or allowable speed along a scanning direction (generally a top-down motion) is more than the maximum of threshold speed of a bottom-up motion. It will be appreciated that elements illustrated, but not specifically described are similar to those described with reference to FIGS. 1-4.

Figure 8:
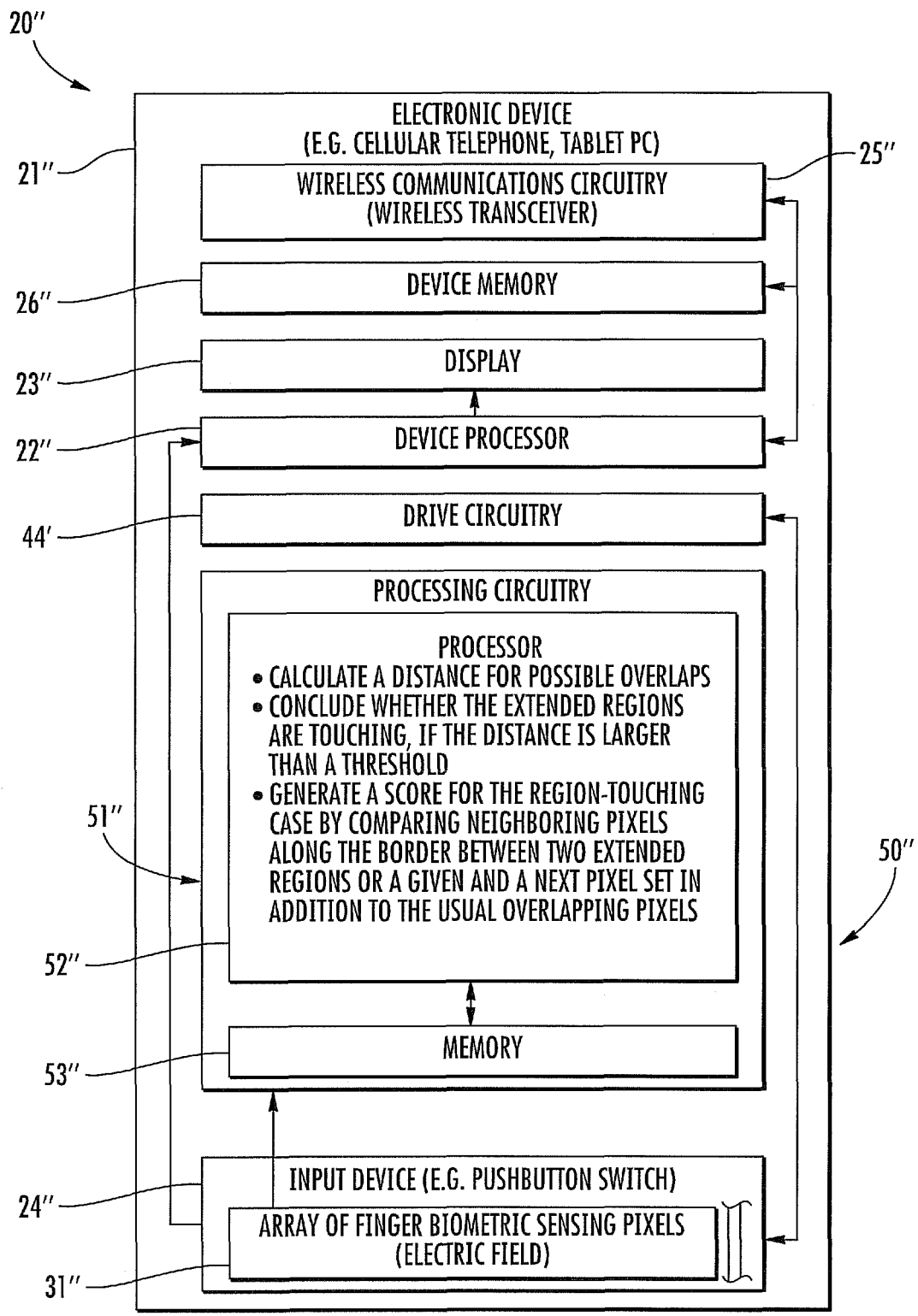
FIG. 8 is a schematic block diagram of an electronic device including a finger biometric sensor in accordance with another embodiment.
Figure 9A:
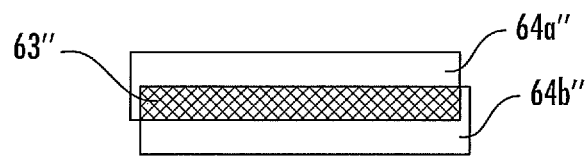
FIG. 9a is a diagram illustrating overlap between a pair of regions of finger biometric sensing pixels in accordance with the embodiment of FIG. 8.
Figure 9B:
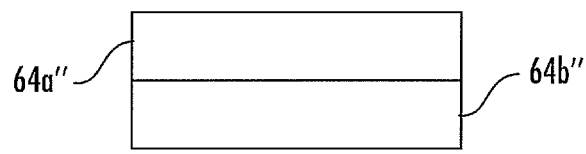
FIG. 9b is a diagram illustrating touching without overlap extended regions of finger biometric sensing pixels in accordance with the embodiment of FIG. 8.
Figure 10:
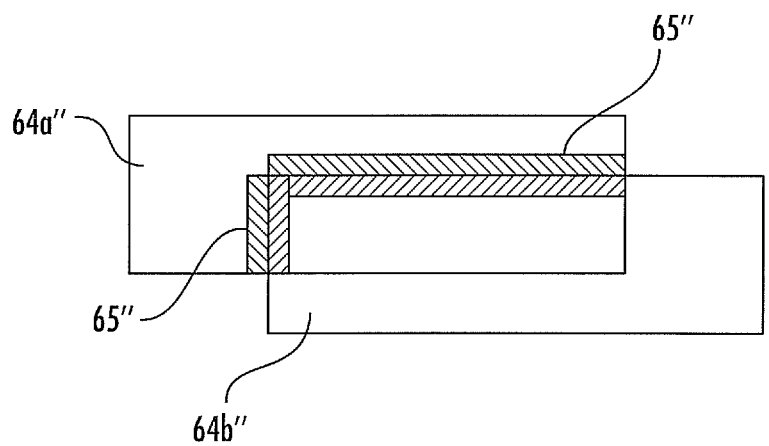
FIG. 10 is a diagram illustrating neighboring pixels between a pair of extended regions at a given alignment in accordance with the embodiment of FIG. 8.

Referring now to FIGS. 8-10, in yet another embodiment, both a finger sliding motion and a finger static position may be supported without the existence of an extended region overlap. However, a relatively complex part of an algorithm for such functionality may be the region correlation, for example. Traditional correlation algorithms based on criteria, such as, for example an average of squared distances (ASD), require a minimum amount of overlap 63" between the pair of regions 64a", 64b" to be correlated (FIG. 9a). However, in the present embodiment, the processing circuitry 51" may extend the correlation to handle the case when the extended regions are just touching (FIG. 9b), which is the case when there is no finger sliding motion. However, there are no overlapping data to be compared, and thus no distance/score can be generated, as will be appreciated by those skilled in the art.

One approach is to use a standard correlation algorithm (e.g., ASD) to calculate the minimum distance for all possible overlaps, and then conclude that the extended regions are touching, if the minimum distance is larger than a threshold. Choosing an appropriate threshold may place a limit on such an approach.

To address the threshold limitation, the processing circuitry 51" may be configured such that a correlation approach may generate a score for the region-touching case. In this approach, the processing circuitry 51" compares neighboring pixels along the border 65" between the two extended regions 64a", 64b" or each pixel set to a next set (i.e., neighboring pixels between overlapping pixel sets), in addition to the usual overlapping pixels. FIG. 10 illustrates neighboring pixels between a pair of extended regions at a given alignment. The rationale behind such a choice is that, at the correct alignment, it may be likely that neighboring pixels have similar values. Accordingly, adding neighboring-pixel correlation to the usual corresponding-pixel correlation may improve correlation performance. Moreover, the correlation or comparison technique described herein may also be applicable to the case when there is overlap between adjacent extended regions.

An example of one aspect of the proposed correlation approach may include the assumption of binary data (an extension to the gray-scale case may also be possible). At a given alignment between a pair of extended regions, the correlation algorithm produces four values:

1. $O^m$: No. of overlapping matched pixels
2. $O^n$: No. of overlapping non-matched pixels
3. $N^m$: No. of neighboring matched pixels
4. $N^n$: No. of neighboring non-matched pixels The alignment problem can be cast as a classification problem using a 4-D "feature" vector ($O^m$, $O^n$, $N^m$, $N^n$) for increasing alignment accuracy. For example, if a linear classifier is used, the correlation score may be a weighted sum of the four features, where the weights are positive for the matches, $O^m$ and $N^m$, and negative for the non-matches, $O^n$ and $N^n$. For the region-touching case, $O^m=O^n=0$, but a score is still obtained from $N^m$ and $N^n$. It will be appreciated that elements illustrated, but not specifically described are similar to those described with reference to FIGS. 1-4.

A method aspect is directed to a method of sensing a finger biometric. The method includes acquiring finger biometric data from an array of finger biometric sensing pixels 31, and generating image data from the finger biometric data. The generating of image data is based upon at least a finger sliding motion when a finger is slid adjacent the array of finger biometric sensing pixels, and a finger static positioning when the finger is statically positioned adjacent the array of finger biometric sensing pixels. The method also includes determining a match between the image data and enrolled image data.

That which is claimed is:

1. A finger biometric sensor comprising:
an array of finger biometric sensing pixels; and
processing circuitry configured to
acquire finger biometric data from the array of finger biometric sensing pixels,
determine one of a finger sliding motion and a finger static positioning,
when the finger is determined to be in sliding motion adjacent the array of finger biometric sensing pixels
acquire further finger biometric data from a section of the array of finger biometric sensing pixels, and
generate image data from the further finger biometric data based upon the finger sliding motion,
when the finger is determined to be statically positioned adjacent the array of finger biometric sensing pixels
acquire further finger biometric data from the array of finger biometric sensing pixels by acquiring a sequence of finger biometric data sets from respective overlapping pixel sets of the array of finger biometric sensing pixels and comparing finger biometric data from neighboring pixels along a border between overlapping pixel sets, and
generate image data from the further finger biometric data based upon the finger static positioning, and
determine a match between the image data and enrolled image data.

2. The finger biometric sensor according to claim 1, wherein the processing circuitry is configured to generate the image data to be of a sufficient amount to permit determining the match between the image data and the enrolled image data.

3. The finger biometric sensor according to claim 1, wherein the processing circuitry is configured to acquire the further finger biometric data by at least acquiring a sequence of finger biometric data sets from respective overlapping pixel sets of the array of finger biometric sensing pixels.

4. The finger biometric sensor according to claim 1, wherein the processing circuitry is configured to compare the sequence of finger biometric data sets by at least determining respective relative alignments of the overlapping pixel sets.

5. The finger biometric sensor according to claim 1, wherein the array of finger biometric finger sensing pixels comprises an array of electric field finger biometric sensing pixels.

6. The finger biometric sensor according to claim 1, further comprising drive circuitry coupled to the array of finger biometric sensing pixels.

7. An electronic device comprising:
a portable housing;
a wireless transceiver carried by the portable housing; and
a finger biometric sensor carried by the portable housing and comprising
an array of finger biometric sensing pixels; and
processing circuitry configured to
acquire finger biometric data from the array of finger biometric sensing pixels,
determine one of a finger sliding motion and a finger static positioning,
when the finger is determined to be in sliding motion adjacent the array of finger biometric sensing pixels
acquire further finger biometric data from a section of the array of finger biometric sensing pixels, and
generate image data from the further finger biometric data based upon the finger sliding motion,
when the finger is determined to be statically positioned adjacent the array of finger biometric sensing pixels
acquire further finger biometric data from the array of finger biometric sensing pixels by acquiring a sequence of finger biometric data sets from respective overlapping pixel sets of the array of finger biometric sensing pixels and comparing finger biometric data from neighboring pixels along a border between overlapping pixel sets, and
generate image data from the further finger biometric data based upon the finger static positioning, and
determine a match between the image data and enrolled image data.

8. The electronic device according to claim 7, wherein the processing circuitry is configured to generate the image data to be of a sufficient amount to permit determining the match between the image data and the enrolled image data.

9. The electronic device according to claim 7, wherein the processing circuitry is configured to compare the sequence of finger biometric data sets by at least determining respective relative alignments of the overlapping pixel sets.

10. The electronic device according to claim 7, further comprising an input device carrying the array of finger biometric sensing pixels.

11. A method of sensing a finger biometric comprising:
acquiring finger biometric data from an array of finger biometric sensing pixels;
determining one of a finger sliding motion and a finger static positioning,
when the finger is determined to be in sliding motion adjacent the array of finger biometric sensing pixels
acquiring further finger biometric data from a section of the array of finger biometric sensing pixels, and
generating image data from the further finger biometric data based upon finger sliding motion,
when the finger is determined to be statically positioned adjacent the array of finger biometric sensing pixels
acquiring further finger biometric data from the array of finger biometric sensing pixels by acquiring a sequence of finger biometric data sets from respective overlapping pixel sets of the array of finger biometric sensing pixels,
comparing finger biometric data from neighboring pixels along a border between overlapping pixel sets, and
generating image data from the further finger biometric data based upon the finger static positioning; and
determining a match between the image data and enrolled image data.

12. The method according to claim 11, wherein generating the image data comprises generating the image data to be of a sufficient amount to permit determining the match between the image data and the enrolled image data.

13. The method according to claim 11, further comprising comparing the sequence of finger biometric data sets by at least determining respective relative alignments of the overlapping pixel sets.

* * * * *